United States Patent
Takaya et al.

(10) Patent No.: US 8,063,558 B2
(45) Date of Patent: Nov. 22, 2011

(54) MULTI-COLOR DISPLAY APPARATUS

(75) Inventors: Itaru Takaya, Tokyo (JP); Toshihide Kimura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 696 days.

(21) Appl. No.: 11/915,710

(22) PCT Filed: Jun. 21, 2006

(86) PCT No.: PCT/JP2006/312837
§ 371 (c)(1),
(2), (4) Date: Nov. 27, 2007

(87) PCT Pub. No.: WO2007/004476
PCT Pub. Date: Jan. 11, 2007

(65) Prior Publication Data
US 2009/0115315 A1     May 7, 2009

(30) Foreign Application Priority Data

Jun. 30, 2005 (JP) .................................. 2005-191290
Jun. 2, 2006 (JP) .................................. 2006-154471

(51) Int. Cl.
*H05B 33/22* (2006.01)
(52) U.S. Cl. ...................................... 313/506; 313/504
(58) Field of Classification Search .......... 313/498–512; 315/169.3; 345/36, 45, 76
See application file for complete search history.

(56) References Cited

U.S. PATENT DOCUMENTS

| | | | |
|---|---|---|---|
| 6,541,130 B2* | 4/2003 | Fukuda | 428/690 |
| 2003/0222575 A1* | 12/2003 | Yamazaki et al. | 313/504 |
| 2003/0231370 A1* | 12/2003 | Fujii | 359/237 |
| 2005/0099118 A1* | 5/2005 | Kobayashi | 313/506 |

FOREIGN PATENT DOCUMENTS

| | | |
|---|---|---|
| JP | 7078689 | 3/1995 |
| JP | 2003-332073 | 11/2003 |
| JP | 2004235015 | 8/2004 |
| JP | 2005-150043 | 6/2005 |

OTHER PUBLICATIONS

PCT International Search Report and Written Opinion of the International Searching Authority, dated Aug. 15, 2006, regarding International Application PCT/JP2006/312837.

* cited by examiner

*Primary Examiner* — Nimeshkumar Patel
*Assistant Examiner* — Christopher Raabe
(74) *Attorney, Agent, or Firm* — Fitzpatrick, Cella, Harper & Scinto

(57) ABSTRACT

Provided is an organic light-emitting device having little apparent deterioration of a durable luminance. The organic light-emitting device includes a hole transport layer and a light-emitting layer which are located in a predetermined order between a reflection electrode for reflecting light and an electrode for transmitting light, the hole transport layer being in contact with the reflection electrode and made of an organic compound, and the light-emitting layer being made of an organic compound, wherein an optical film thickness L of the hole transport layer is set in a range of $0.25\lambda \times (2n-1.7)$ to $0.25\lambda \times (2n-1.3)$, where $\lambda$ indicates an emission wavelength and n indicates a positive integer.

10 Claims, 2 Drawing Sheets

MULTI-COLOR DISPLAY APPARATUS

TECHNICAL FIELD

The present invention relates to an organic light-emitting device including a hole transport layer and a light-emitting layer which are stacked in a predetermined order between a reflection electrode for reflecting light and a transparent electrode for transmitting light, wherein the hole transport layer is in contact with the reflection electrode and made of an organic compound, and the light-emitting layer is made of an organic compound. In addition, the present invention relates to a multi-color display apparatus using the organic light-emitting device.

BACKGROUND ART

FIG. 3 is a schematic view showing an example of a stacked structure of a top-emission organic light-emitting device. As shown in FIG. 3, in the organic light-emitting device (organic electroluminescence (EL) device), layers each made of an organic compound are stacked between a reflection electrode (anode) 21 for reflecting light which is provided on a support substrate 20 and a transparent electrode (cathode) "b" for transmitting light. For example, a hole transport layer 22, a light-emitting layer 23, an electron transport layer 24, and an electron injection layer 25 are stacked in mentioned order from the side of the reflection electrode.

For an organic light-emitting device of this type, there have been attempts to set an optical thickness of each of the layers in order to improve the light-extraction efficiency by an interference effect and to set a light-emitting region in order to prevent the reduction of internal quantum efficiency due to current flow. Japanese Patent Application Laid-open No. H07-78689 (page 2, lines 5 to 10) discloses that an emission peak of light generated in a light-emitting layer is made equal to an interference peak caused by an interference effect and used for light to pass through each of the stacked layers in order to improve the emission luminance of the organic light-emitting device. Japanese Patent Application Laid-open No. 2004-235015 (page. 2, lines 4 and 5) discloses that a light-emitting region of the light-emitting layer is set at a position away from an interface between the light-emitting layer and an adjacent layer by a predetermined distance in order to improve a lifetime characteristic. Japanese Patent Application Laid-open No. 2005-150043 (page 5, lines 47 to 50 and page 6, lines 6 to 11) describes that an optical distance from a reflection plane to an anode-side interface layer of an organic light-emitting layer is made shorter than one-fourth of a shortest wavelength of light emitted from the organic light-emitting layer in order to extract the light emitted from the light-emitting layer without changing an original color of the emitted light.

In the conventional organic light-emitting devices, the light-extraction efficiency is improved by the interference effect, and the internal quantum efficiency is stabilized by the light-emitting region control. However, the reduction of the light-extraction efficiency which is caused by change in a light-emitting region with the elapse of time as well as a measure to avoid the reduction are not known at all.

That is, even when the light-extraction efficiency is improved by the interference effect, a light-emitting device made of a conventionally known organic material has a problem that the internal quantum efficiency is gradually reduced by current flow, or the light-emitting region is gradually changed to reduce the light-extraction efficiency. The inventors of the present invention actually recognized a phenomenon that, even when the light-extraction efficiency of an organic light-emitting device using generally known tris[8-hydroxyquinolinate]aluminum ($Alq_3$) as a material of a light-emitting layer was improved by optimizing the interference effect, the luminance of the device significantly was reduced by current flow.

As described above, although the organic light-emitting device in which the light-extraction efficiency is improved by the interference effect has an improved initial light emission efficiency, reduction in internal quantum efficiency and light-extraction efficiency simultaneously occur in the device. Therefore, there is a problem that the durability for stable light emission reduces. Then, when the device is used to produce a display apparatus, there is a problem that burn-in occurs.

DISCLOSURE OF THE INVENTION

The present invention has been made in view of the above-mentioned circumstances. An object of the present invention is to provide an organic light-emitting device having little apparent deterioration of a durable luminance, and a multi-color display apparatus having no burn-in which is produced by using the organic light-emitting device.

According to one aspect of the present invention, a multi-color display apparatus includes: organic light-emitting devices for emitting lights of at least three colors of red, blue and green, respectively, each of the devices includes a first electrode for reflecting light, a carrier transport layer, a light-emitting layer, and a second electrode for transmitting light, which are stacked in mentioned order, wherein an optical film thickness $L_R$ of the carrier transport layer of the red light-emitting device is within a range expressed by $0.25\lambda_R \times (2n-\phi/\pi-0.7) < L_R < 0.25\lambda_R \times (2n-\phi/\pi-0.5)$ where $\lambda_R$ indicates an emission wavelength in the light-emitting layer of the red light-emitting device, n indicates a positive integer, and $\phi$ indicates a phase shift on the first electrode; an optical film thickness $L_G$ of the carrier transport layer of the green light-emitting device is within a range expressed by $0.25\lambda_G \times (2n-\phi/\pi-0.6) < L_G < 0.25\lambda \times (2n-\phi/\pi-0.4)$ where $\lambda_G$ indicates an emission wavelength in the light-emitting layer of the green light-emitting device, n indicates the positive integer, and $\phi$ indicates the phase shift on the first electrode; and an optical film thickness $L_B$ of the carrier transport layer of the blue light-emitting device is within a range expressed by $0.25\lambda_B \times (2n-\phi/\pi-0.5) < L_B < 0.25\lambda_B \times (2n-\phi/\pi-0.3)$ where $\lambda_B$ indicates an emission wavelength in the light-emitting layer of the blue light-emitting device, n indicates the positive integer, and $\phi$ indicates the phase shift on the first electrode.

According to another aspect of the present invention, a multi-color display apparatus includes organic light-emitting devices for emitting lights of at least three colors of red, blue and green, respectively, each of the devices includes a first electrode for reflecting light, a carrier transport layer, a light-emitting layer, and a second electrode for transmitting light, which are stacked in mentioned order, wherein a sum $L_R + L_{eR}$ of an optical film thickness $L_R$ of the carrier transport layer of the red light-emitting device and an optical film thickness $L_{eR}$ of the light-emitting layer of the red light-emitting device is within a range expressed by $0.25\lambda \times (2n-\phi/\pi+0.3) < L_R + L_{eR} < 0.25\lambda_R \times (2n-\phi/\pi+0.5)$ where $\lambda_R$ indicates an emission wavelength in the light-emitting layer of the red light-emitting device, n indicates a positive integer, and $\phi$ indicates a phase shift on the first electrode; a sum $L_G + L_{eG}$ of an optical film thickness $L_G$ of the carrier transport layer of the green light-emitting device and an optical film thickness $L_{eG}$ of the light-emitting layer of the green light-emitting device is within a range expressed by $0.25\lambda_G \times (2n-\phi/\pi+0.4) < L_G + L_{eG} < 0.25\lambda_G \times (2n-\phi/\pi+0.6)$ where $\lambda_G$ indicates an emission wavelength in the light-emitting layer of the green light-emitting device, n indicates the positive integer, and $\phi$ indicates the phase shift on the first electrode; and a sum $L_B + L_{eB}$ of an optical film thickness $L_B$ of the carrier transport layer of the blue light-emitting device and an optical film thickness $L_{eB}$ of the light-emitting layer of the blue light-emitting device is within a range expressed by $0.25\lambda_B \times (2n-\phi/\pi+0.5) < L_B + L_{eB} < 0.25\lambda_B \times (2n-\phi/\pi+0.7)$ where $\lambda_B$ indicates an emission wavelength in the light-emitting layer of the blue light-emitting device, n indicates the positive integer, and $\phi$ indicates the phase shift on the first electrode.

According to another aspect of the present invention, a multi-color display apparatus includes organic light-emitting devices for emitting lights of at least three colors of red, blue and green, respectively, each of the devices includes a reflection layer for reflecting light, a first electrode for transmitting light, a carrier transport layer, a light-emitting layer, and a second electrode for transmitting light, which are stacked in mentioned order, wherein a sum $L_{aR} + L_R$ of an optical film thickness $L_{aR}$ of the first electrode of the red light-emitting device and an optical film thickness $L_R$ of the carrier transport layer of the red light-emitting device is within a range expressed by $0.25\lambda_R \times (2n-\phi/\pi-0.7) < L_{aR} + L_R < 0.25\lambda_R \times (2n-\phi/\pi-0.5)$ where $\lambda_R$ indicates an emission wavelength in the light-emitting layer of the red light-emitting device, n indicates a positive integer, and $\phi$ indicates a phase shift on the reflection layer; a sum $L_{aG} + L_G$ of an optical film thickness $L_{aG}$ of the first electrode of the green light-emitting device and an optical film thickness $L_G$ of the carrier transport layer of the green light-emitting device is within a range expressed by $0.25\lambda_G \times (2n-\phi/\pi n-0.6) < L_{aG} + L_G < 0.25\lambda_G \times (2n-\phi/\pi-0.4)$ where $\lambda_G$ indicates an emission wavelength in the light-emitting layer of the green light-emitting device, n indicates the positive integer, and $\phi$ indicates the phase shift on the reflection layer; and a sum $L_{aB} + L_B$ of an optical film thickness $L_{aB}$ of the first electrode of the blue light-emitting device and an optical film thickness $L_B$ of the carrier transport layer of the blue light-emitting device is within a range expressed by $0.25\lambda_B \times (2n-\phi/\pi-0.5) < L_{aB} + L_B < 0.25\lambda_B \times (2n-\phi/\pi-0.3)$ where $\lambda_B$ indicates an emission wavelength in the light-emitting layer of the blue light-emitting device, n indicates the positive integer, and $\phi$ indicates the phase shift on the reflection layer.

According to another aspect of the present invention, a multi-color display apparatus includes organic light-emitting devices for emitting lights of at least three colors of red, blue and green, respectively, each of the devices includes a reflection layer for reflecting light, a first electrode for transmitting light, a carrier transport layer, a light-emitting layer, and a second electrode for transmitting light, which are stacked in mentioned order, wherein a sum $L_{aR} + L_R + L_{eR}$ of an optical film thickness $L_{aR}$ of the first electrode of the red light-emitting device, an optical film thickness $L_R$ of the carrier transport layer of the red light-emitting device, and an optical film thickness $L_{eR}$ of the light-emitting layer of the red light-emitting device is within a range expressed by $0.25\lambda_R \times (2n-\phi/\pi+0.3) < L_{aR} + L_R + L_{eR} < 0.25\lambda_R \times (2n-\phi/\pi+0.5)$ where $\lambda_R$ indicates an emission wavelength in the light-emitting layer of the red light-emitting device, n indicates a positive integer, and $\phi$ indicates a phase shift on the reflection layer; a sum $L_{aG} + L_G + L_{eG}$ of an optical film thickness $L_{aG}$ of the first electrode of the green light-emitting device, an optical film thickness $L_G$ of the carrier transport layer of the green light-emitting device, and an optical film thickness $L_{eG}$ of the light-emitting layer of the green light-emitting device is within a range expressed by $0.25\lambda_G \times (2n-\phi/\pi+0.4) < L_{aG} + L_G + L_{eG} < 0.25\lambda_G \times (2n-\phi/\pi+0.6)$ where $\lambda_G$ indicates an emission wavelength in the light-emitting layer of the green light-emitting device, n indicates the positive integer, and $\phi$ indicates the phase shift on the reflection layer; and a sum $L_{aB} + L_B + L_{eB}$ of an optical film thickness $L_{aB}$ of the first electrode of the blue light-emitting device, an optical film thickness $L_B$ of the carrier transport layer of the blue light-emitting device, and an optical film thickness $L_{eB}$ of the light-emitting layer of the blue light-emitting device is within a range expressed by $0.25\lambda_B \times (2n-\phi/\pi+0.5) < L_{aB} + L_B + L_{eB} < 0.25\lambda_B \times (2n-\phi/\pi+0.7)$ where $\lambda_B$ indicates an emission wavelength in the light-emitting layer of the blue light-emitting device, n indicates the positive integer, and $\phi$ indicates the phase shift on the reflection layer.

According to the present invention, light-extraction efficiency is gradually improved by current flow. Therefore, the improvement of light-extraction efficiency is balanced with the reduction of an internal quantum efficiency due to the current flow, so that apparent deterioration of a durable luminance can be almost eliminated. Then, the present invention exerts an excellent effect that a multi-color display apparatus having little burn-in can be provided.

BEST MODE FOR CARRYING OUT THE INVENTION

Figure 1:
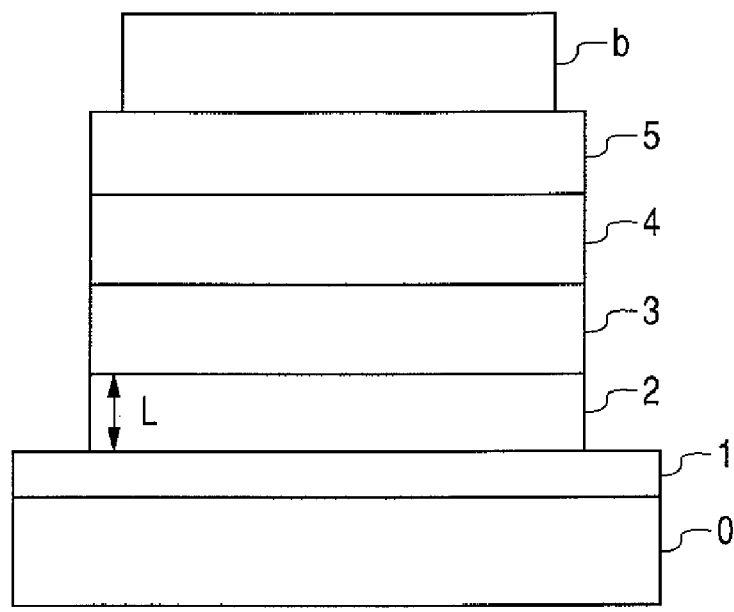
FIG. 1 is a schematic view showing a top-emission organic light-emitting device including a reflection electrode according to the present invention.

Hereinafter, a best mode for carrying out the present invention will be described. The present invention is not limited to this mode.

A multi-color display apparatus according to the present invention includes organic light-emitting devices (organic electroluminescence (EL) device) for emitting lights of at least three colors of red, blue and green, respectively, each of the devices having a first electrode for reflecting light, a carrier transport layer, a light-emitting layer, and a second electrode for transmitting light, which are stacked in mentioned order. In each of the organic light-emitting devices, an optical distance L between an initial light-emitting plane and a reflection plane is set to be in a range from a distance shorter to a distance longer than "emission wavelength $\lambda \times 0.25 \times (2n-\phi/\pi)$" which is "an enhancement condition by interference", by 30% to 70% of $0.25\lambda$, wherein n indicates a positive integer and $\phi$ indicates a phase shift on the reflection plane.

In other words, when the light-emitting plane is moved apart from the reflection plane in use of the device during current flow, the optical distance L is set to be shorter than the enhancement condition by 30% to 70% of "emission wavelength $\lambda \times 0.25$". When the light-emitting plane is moved close to the reflection plane in use of the device during current flow, the optical distance L is set to be longer than the enhancement condition by 30% to 70% of "emission wavelength $\lambda \times 0.25$".

Therefore, the optical distance L between the light-emitting plane and the reflection plane approaches the enhancement condition by interference in use of the device during current flow, with a result that it is possible to provide a multi-color display apparatus in which the apparent deterioration of a durable luminance is suppressed. The reason why the optical distance L between the initial light-emitting plane and the reflection plane is set to be in a range of a distance shorter to a distance longer than the enhancement condition by 30% to 70% of "λ×0.25" is that, when the optical distance is outside the above range, the degree of deterioration of the durable luminance becomes large, so that it is unsuitable for use in a display apparatus.

In order to improve the light-extraction efficiency, it is preferable to set the optical distance L between the light-emitting plane and the reflection plane to the enhancement condition by interference. When a metal is used for the reflection plane, a value of the phase shift φ becomes a value close to π. Therefore, when the optical distance L is odd multiples of "emission wavelength λ×0.25", a phase of light extracted after the reflection on the reflection plane is coincided with phase of light directly extracted from the light-emitting layer, with a result that the light-extraction efficiency becomes maximum.

However, the inventors of the present invention have found that, although the light-emitting plane is located in any of interfaces of the light-emitting layer at the time of initial current flow, the light-emitting plane spreads to an inner portion of the light-emitting layer in use of the device during current flow. In other words, when the optical distance L is set so as to maximize the light-extraction efficiency at the time of initial current flow, the optical distance lies outside the enhancement condition by interference in use of the device during current flow, thereby reducing a emission luminance.

As a result of concentrated studies, it has been found that, when the optical distance L between the initial light-emitting plane and the reflection plane is set to be shorter or longer than the odd multiples of "emission wavelength λ×0.25" by a predetermined rate, the deterioration of the durability of emission luminance can be suppressed.

Here, the light-emitting plane in the present invention indicates a plane which is located in the light-emitting layer made of an organic material and has a highest light emission intensity. A position of the light-emitting plane of the light-emitting layer is determined based on a carrier transport property of the light-emitting layer. When the light-emitting layer has an electron transport property, the light-emitting plane at the beginning of current flow becomes an interface of the light-emitting layer on the anode side. When the light-emitting layer has a hole transport property, the light-emitting plane at the beginning of current flow becomes an interface of the light-emitting layer on the cathode side. Then, the light-emitting plane located in interface of the light-emitting layer on the anode side or the light-emitting plane located in the interface of the light-emitting layer on the cathode side spreads to the inner portion of the light-emitting layer in use of the device during current flow. In the present invention, the carrier transport property of the light-emitting layer is defined as a transport property based on larger one of electron mobility and hole mobility.

The reflection plane indicates a surface of a metal layer. When emitted light is to be extracted from the anode side, the reflection plane is provided on the cathode side. When emitted light is to be extracted from the cathode side, the reflection plane is provided on the anode side.

A difference between such device structures causes the light-emitting plane to move apart from the reflection plane or close thereto in use of the device during current flow. Therefore, the optical distance L between the initial light-emitting plane and the reflection plane is set to be shorter or longer than the enhancement condition by interference corresponding to a device structure.

To be specific, when the reflection plane is located on the cathode side and an organic material of the hole transport property is used for the light-emitting layer or when the reflection plane is located on the anode side and an organic material of the electron transport property is used for the light-emitting layer, the optical distance between the initial light-emitting plane and the reflection plane is set to be shorter than the enhancement condition by interference. To be more specific, when the reflection plane is located on the cathode side and the organic material of the hole transport property is used for the light-emitting layer, a film thickness of an electron transport layer or an electron injection layer which is the carrier transport layer, a film thickness of a transparent conductive layer, or the like is set to be shorter than the enhancement condition by interference. When the reflection plane is located on the anode side and the organic material of the electron transport property is used for the light-emitting layer, a film thickness of a hole transport layer or a hole injection layer which is the carrier transport layer, a film thickness of the transparent conductive layer, or the like is set to be shorter than the enhancement condition by interference.

On the other hand, when the reflection plane is located on the anode side and the organic material of the hole transport property is used for the light-emitting layer or when the reflection plane is located on the cathode side and the organic material of the electron transport property is used for the light-emitting layer, the optical distance between the initial light-emitting plane and the reflection plane is set to be longer than the enhancement condition by interference. To be more specific, when the reflection plane is located on the anode side and the organic material of the hole transport property is used for the light-emitting layer, a film thickness of the light-emitting layer, a film thickness of the hole transport layer or the hole injection layer which is the carrier transport layer, a film thickness of the transparent conductive layer, or the like is set to be longer than the enhancement condition by interference. When the reflection plane is located on the cathode side and the organic material of the electron transport property is used for the light-emitting layer, a film thickness of the light-emitting layer, a film thickness of the electron transport layer or the electron injection layer which is the carrier transport layer, a film thickness of the transparent conductive layer, or the like is set to be longer than the enhancement condition by interference.

As a result of more concentrated studies, it has been found that it is preferable to set the optical distance in a multi-color display apparatus including organic light-emitting devices for emitting lights of at least three colors of red, green and blue, respectively, as follows.

When the optical distance between the initial light-emitting plane and the reflection plane is set to be shorter than the enhancement condition by interference, the following setting is performed.

In other words, in the case of the red light-emitting device, it is preferable that the optical distance L between the initial light-emitting plane and the reflection plane be set to be shorter than λ (emission wavelength)×0.25×(2n−φ/π) by 50% to 70% of $0.25\lambda_R$. That is, it is preferable to set L in a range expressed by "$0.25\lambda_R \times (2n-\phi/\pi-0.7) < L < (0.25\lambda_R \times (2n-\phi/\pi-0.5))$", wherein $\lambda_R$ indicates a spectral peak of an emission wavelength, n indicates the positive integer, and φ indicates the phase shift on the reflection plane.

In the case of the green light-emitting device, it is preferable that the optical distance L between the initial light-emitting plane and the reflection plane be set to be shorter than λ (emission wavelength)×0.25×(2n−φ/π) by 40% to 60% of $0.25\lambda_R$. That is, it is preferable to set L in a range expressed by "$0.25\lambda_G \times (2n-\phi/\pi - 0.6)) < L < (0.25\lambda_G \times (2n-\phi/\pi - 0.4))$", wherein $\lambda_G$ indicates a spectral peak of an emission wavelength, n indicates the positive integer, and φ indicates the phase shift on the reflection plane.

In the case of the blue light-emitting device, it is preferable that the optical distance L between the initial light-emitting plane and the reflection plane be set to be shorter than λ (emission wavelength)×0.25×(2n−φ/π) by 30% to 50% of $0.25\lambda_R$. That is, it is preferable to set L in a range expressed by "$0.25\lambda_B \times (2n-\phi/\pi - 0.5)) < L < (0.25\lambda_B \times (2n-\phi/\pi - 0.3))$", wherein $\lambda_B$ indicates a spectral peak of an emission wavelength, n indicates the positive integer, and φ indicates the phase shift on the reflection plane.

On the other hand, when the optical distance between the initial light-emitting plane and the reflection plane is set to be longer than the enhancement condition by interference, the following setting is performed.

In other words, in the case of the red light-emitting device, it is preferable that the optical distance L between the initial light-emitting plane and the reflection plane be set to be longer than λ (emission wavelength)×0.25×(2n−φ/π) by 30% to 50% of $0.25\lambda_R$. That is, it is preferable to set L in a range expressed by "$0.25\lambda_R \times (2n-\phi/\pi + 0.3)) < L < (0.25\lambda_R \times (2n-\phi/\pi + 0.5))$", wherein $\lambda_R$ indicates the spectral peak of the emission wavelength, n indicates the positive integer, and φ indicates the phase shift on the reflection plane.

In the case of the green light-emitting device, it is preferable that the optical distance L between the initial light-emitting plane and the reflection plane be set to be longer than λ (emission wavelength)×0.25×(2n−φ/π) by 40% to 60% of $0.25\lambda_R$. That is, it is preferable to set L in a range expressed by "$0.25\lambda_G \times (2n-\phi/\pi + 0.4)) < L < (0.25\lambda_G \times (2n-P/n + 0.6))$", wherein $\lambda_G$ indicates the spectral peak of the emission wavelength, n indicates the positive integer, and φ indicates the phase shift on the reflection plane.

In the case of the blue light-emitting device, it is preferable that the optical distance L between the initial light-emitting plane and the reflection plane be set to be longer than λ (emission wavelength)×0.25×(2n−φ/π) by 50% to 70% of $0.25\lambda_R$. That is, it is preferable to set L in a range expressed by "$0.25\lambda_B \times (2n-\phi/\pi + 0.5)) < L < (0.25\lambda_B \times (2n-\phi/\pi + 0.7))$", wherein $\lambda_B$ indicates the spectral peak of the emission wavelength, n indicates the positive integer, and φ indicates the phase shift on the reflection plane.

When the above-mentioned setting is performed, it has been found that, although an initial emission luminance becomes smaller, the light-extraction efficiency is gradually improved by the current flow, so that the improvement of the light-extraction efficiency is balanced with a reduction in internal quantum efficiency which is caused due to the current flow. Then, it has been found that a multi-color display apparatus having little apparent deterioration of a durable luminance can be manufactured.

The multi-color display apparatus of the present invention includes the organic light-emitting devices for emitting lights of at least three colors of red, blue and green, respectively, means that the multi-color display apparatus can further include an organic light-emitting device for emitting light of color other than the above three colors. For example, a cyan or yellow light-emitting device may be used in addition to the red, green and blue light-emitting devices. The carrier transport layer is a layer having a function for transporting at least one of an electron or a hole from the electrode to the light-emitting layer. Therefore, any of the hole transport layer, the hole injection layer, the electron transport layer, and the electron injection layer can become the carrier transport layer described for the present invention.

The present invention also includes a white light-emitting device. In the case of white color, it is difficult to specify the spectral peak wavelength λ, so that a relationship between λ and the optical distance between the initial light-emitting plane and the reflection electrode cannot be expressed. However, it is necessary to shorten an optical film thickness, which makes the light extraction efficiency maximum, by 30% to 70% thereof.

A multi-color display apparatus can also be manufactured by using the organic light-emitting device according to the present invention for white light-emitting device and combining the device with a color filter. A multi-color display apparatus can also be manufactured by using the organic light-emitting device according to the present invention for blue light-emitting device and combining the device with a color conversion layer.

As described above, in the top-emission light-emitting device, the optical distance between the initial light-emitting plane and the reflection electrode is set to be shorter or longer than the odd multiples of "λ(emission wavelength)×0.25" by a predetermined rate. Therefore, it is possible to manufacture the organic light-emitting device in which the apparent deterioration of durability is suppressed.

Hereinafter, the embodiment of the present invention will be described in more detail with reference to FIGS. 1 and 2. The structure of a top-emission organic light-emitting device using an anode as the reflection plane and an organic material of the electron transport property for the light-emitting layer, for constituting a display apparatus in which light is extracted from an electrode opposed to a substrate, will be described here.

The present invention is not necessarily limited to the above-mentioned structure. The present invention includes a bottom emission structure in which light is extracted from a substrate side, a structure in which an electrode located on the substrate side is a cathode, and a structure in which an organic material of the hole transport property is used for the light-emitting layer.

FIG. 1 is a schematic view showing a top-emission organic light-emitting device including a reflection electrode, which constitutes a multi-color display apparatus according to the present invention. In FIG. 1, reference numeral 0 denotes a support substrate, 1 denotes a reflection electrode (first electrode), 2 denotes a hole transport layer (carrier transport layer), 3 denotes a light-emitting layer, 4 denotes an electron transport layer, 5 denotes an electron injection layer, and reference symbol "b" denotes an electrode for transmitting light (second electrode). FIG. 2 is a schematic view showing a top-emission organic light-emitting device including a reflection layer and an electrode for transmitting light, which constitutes the multi-color display apparatus according to the present invention. In FIG. 2, reference numeral 10 denotes a support substrate, 11 denotes a reflection layer, reference symbol "a" denotes an electrode for transmitting light (first electrode), reference numeral 12 denotes a hole transport layer, 13 denotes a light-emitting layer, 14 denotes an electron transport layer, 15 denotes an electron injection layer, and reference symbol "b" denotes an electrode for transmitting light (second electrode).

According to the present invention, in the case of the organic light-emitting device shown in FIG. 1, a range of the optical film thickness L of the hole transport layer 2 which is the carrier transport layer is set corresponding to the emission wavelength λ in the light-emitting layer 3. In the case of the organic light-emitting device shown in FIG. 2, the optical film thickness L of the hole transport layer 12 which is the carrier transport layer and an optical film thickness $L_a$ of the electrode "a" for transmitting light are set corresponding to the emission wavelength λ in the light-emitting layer 13.

The organic light-emitting device shown in FIG. 1 includes the reflection electrode 1 for reflecting light, which is located on the support substrate 0 and serves as the anode. Here, the "electrode for reflecting light" means a metal electrode having a reflectance equal to or larger than 50%. Examples of a metal used for the reflection electrode 1 include Cr, Al, Ag, an alloy thereof, and the like. A metal having a higher reflectance is preferable.

Figure 2:
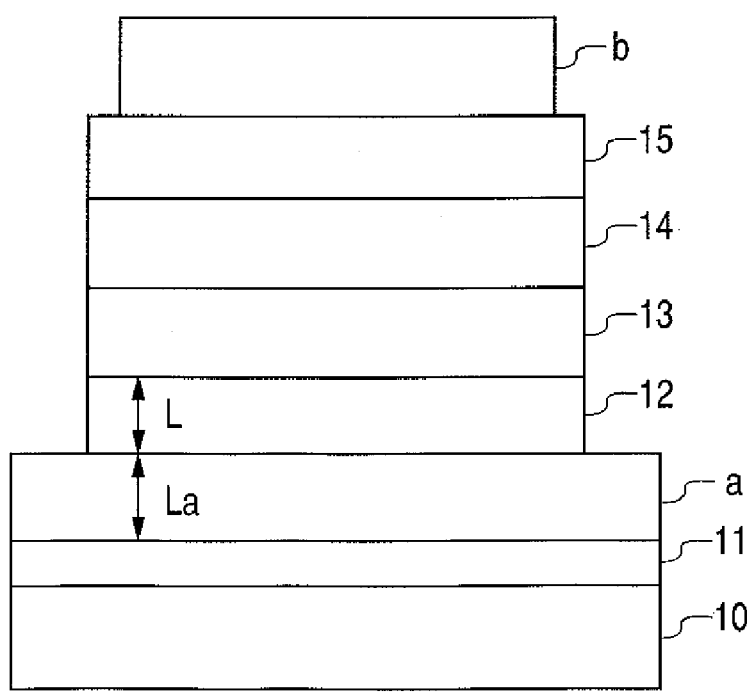
FIG. 2 is a schematic view showing a top-emission organic light-emitting device having a transparent electrode provided with a reflection layer according to the present invention.

In the organic light-emitting device shown in FIG. 2, a stacked member composed of the reflection layer 11 for reflecting light and the electrode "a" for transmitting light to inject charges can be used instead of the reflection electrode 1. The same metal as that of the reflection electrode 1 can be used for the reflection layer 11. A transparent conductive material such as ITO or IZO is used for the electrode "a" for transmitting light. A transparent conductive material having a reflectance equal to or larger than 50% can be used. A transparent conductive material having a higher reflectance is preferable. The transparent conductive material is selected from materials which do not oxidize the reflection layer 11. To be specific, for example, when the reflection layer 11 is made of Ag or an Ag array, IZO is selected for the electrode "a" for transmitting light. A combination of Ag/IZO or a combination of Ag-alloy/IZO is preferable in view of a refractive index because of high reflectance.

In the present invention, the hole transport layer 2 or 12 which is the carrier transport layer and made of an organic compound is formed on and in contact with the reflection electrode 1 of FIG. 1 or the electrode "a" for transmitting light as shown in FIG. 2, and the light-emitting layer 3 or 13 made of an organic compound is further formed thereon in the same manner. A conventionally known material can be used as the organic compound for forming each of the hole transport layers 2 and 12 and the light-emitting layers 3 and 13. The electron transport layer 4 or 14 and the electron injection layer 5 or 15, each of which is the carrier transport layer, may be formed on the light-emitting layer 3 or 13. Even in such a case, conventionally known materials can be used therefor. The electrode "b" for transmitting light is stacked on each of the electron injection layer 5 and 15. The same material as that of the electrode "a" for transmitting light can be used as a material for forming the electrode "b" for transmitting light.

A semi-transparent metal film may be used for the electrode "b" for transmitting light. The semi-transparent metal film transmits a part of incident light and reflects a part thereof, so that it is possible to use light enhancement caused by resonance between a reflection plane of the metal thin film and a reflection plane of the reflection electrode 1 or light enhancement caused by resonance between the reflection plane of the metal thin film and a reflection plane of the reflection electrode 11. Therefore, the light-extraction efficiency can be improved. It is preferable that the same metal as that of the reflection electrode or the reflection layer be used for the semi-transparent metal film, and absorption thereof be equal to or smaller than 50%. In the case of the absorption of 50% or less, any metal can be used without depending on a ratio between the transmission and reflection. A film thickness of the metal film is preferably 5 nm to 20 nm. This is because, when the film thickness is smaller than 5 nm, sufficient carrier injection cannot be performed, so that the metal film does not serve as the electrode. In addition, this is because, when the film thickness is larger than 20 nm, the metal film does not transmit light, so that the light cannot be extracted to the outside.

In the present invention, an optical film thickness of reflection side, more specifically, the optical film thickness L of the hole transport layer 2 shown in FIG. 1, or an optical film thickness sum $L_a+L$ of the electrode "a" for transmitting light and the hole transport layer 12 as shown in FIG. 2 is set with respect to the emission wavelength λ of light emitted from the light-emitting layer 3 or 13. The optical film thickness is set in a range of "$0.25\lambda \times (2n-\phi/\pi-0.7)$" to "$0.25\lambda_R \times (2n-\phi/\pi-0.3)$", wherein n indicates the positive integer and φ indicates the phase shift on the reflection electrode. The emission wavelength λ is defined as not an emission wavelength from the organic light-emitting device but a spectral peak of light emitted from the light-emitting layer 3 or 13, and obtained based on a light emission spectrum generated when a light-emitting layer material is irradiated with ultraviolet light. Each of the optical film thickness L of the hole transport layer 2 or 12 and the optical film thickness $L_a$ of the transparent electrode "a" is defined as the product of a film thickness and a refractive index. The refractive index is changed according to a measured wavelength in some cases. In such cases, the refractive index is defined as a refractive index at the emission wavelength λ of light emitted from the light-emitting layer 3 or 13.

In this embodiment, an initial light-emitting region of the organic light-emitting device is located close to an interface between the hole transport layer 2 or 12 and the light-emitting layer 3 or 13. Here, a phenomenon is observed in which a material close to the interface is deteriorated by current flow and the light-emitting region slowly moves to an inner portion of the light-emitting layer. When the light-extraction efficiency is to be optimized for the initial light-emitting region, the light-extraction efficiency is highest in the case where the optical film thickness on the opposite side is λ (emission wavelength)$\times 0.25 \times (2n-\phi/\pi)$ (where n indicates the positive integer). In this embodiment, the optical film thickness L of the hole transport layer 2 or the optical film thickness sum $L+L_a$ of the hole transport layer 12 and the transparent electrode "a" is set to be smaller than "$0.25\lambda \times (2n-1)$", which is an initial optimal value, by 30% to 70% of 0.25λ. Therefore, the light-extraction efficiency is gradually improved by the current flow. Thus, the improvement of the light-extraction efficiency is balanced with a reduction in internal quantum efficiency which is caused by the current flow, so that the apparent deterioration of a durable luminance can be almost eliminated.

To be specific, a multi-color display apparatus including organic light-emitting devices for emitting lights of three colors of red, blue and green, respectively, each of which is the organic light-emitting device according to the present invention, is produced as follows. In other words, when an emission wavelength in a red light-emitting layer is expressed by $\lambda_R$, an optical film thickness of the reflection side of the red light-emitting device is set to be smaller than $0.25\lambda_R \times (2n-\phi/\pi)$ by 50% to 70% of $0.25\lambda_R$. When an emission wavelength in a green light-emitting layer is expressed by $\lambda_G$, an optical film thickness of the reflection side of the green light-emitting device is set to be smaller than $0.25\lambda_G \times (2n-\phi/\pi)$ by 40% to 60% of $0.25\lambda_G$. When an emission wavelength in a blue light-emitting layer is expressed by $\lambda_B$ an optical film thickness of the reflection side of a hole transport layer of the blue light-emitting device is set to be smaller than $0.25\lambda_B \times (2n-\phi/\pi)$ by 30% to 50% of $0.25\lambda_B$. In this way, the apparent deterioration of the durable luminance can be almost eliminated.

To be more specific, a multi-color display apparatus including organic light-emitting devices for emitting lights of three colors of red, blue and green, respectively, each of which is the organic light-emitting device shown in FIG. 1, is produced as follows. In other words, in the case of the red light-emitting device, an optical film thickness $L_R$ of the hole transport layer 2 is set in a range expressed by $0.25\lambda_R \times (2n-\phi/\pi-0.7) < L_R < 0.25\lambda_R \times (2n-\phi/\pi-0.5)$. In the case of the green light-emitting device, an optical film thickness $L_G$ of the hole transport layer 2 is set in a range expressed by $0.25\lambda_G \times (2n-\phi/\pi-0.6) < L_G < 0.25\lambda_G \times (2n-\phi/\pi-0.4)$. In the case of the blue light-emitting device, an optical film thickness $L_B$ of the hole transport layer 2 is set in a range expressed by $0.25\lambda_B \times (2n-\phi/\pi-0.5) < L_B < 0.25\lambda_B \times (2n-\phi/\pi-0.3)$. Here, $\lambda_R$ indicates the emission wavelength in the organic red light-emitting layer, $\lambda_G$ indicates the emission wavelength in the organic green light-emitting layer, $\lambda_B$ indicates the emission wavelength in the organic blue light-emitting layer, and n indicates the positive integer.

A multi-color display apparatus including organic light-emitting devices for emitting lights of three colors of red, blue and green, respectively, each of which is the organic light-emitting device shown in FIG. 2, is produced as follows. In other words, in the case of the red light-emitting device, the sum $L_{aR}+L_R$ of optical film thicknesses of the transparent electrode "a" and the hole transport layer 12 is set in a range expressed by $0.25\lambda_R \times (2n-\phi/\pi-0.7) < L_{aR}+L_R < 0.25\lambda_R \times (2n-\phi/\pi-0.5)$. In the case of the green light-emitting device, the sum $L_{aG}+L_G$ of optical film thicknesses of the transparent electrode "a" and the hole transport layer 12 is set in a range expressed by $0.25\lambda_G \times (2n-\phi/\pi-0.6) < L_{aG}+L_G < 0.25\lambda_G \times (2n-\phi/\pi-0.4)$. In the case of the blue light-emitting device, the sum $L_{aB}+L_B$ of optical film thicknesses of the transparent electrode "a" and the hole transport layer 12 is set in a range expressed by $0.25\lambda_B \times (2n-\phi/\pi-0.5) < L_{aB}+L_B < 0.25\lambda_B \times (2n-\phi/\pi-0.3)$. Here, $\lambda_R$ indicates the emission wavelength in the organic red light-emitting layer, $\lambda_G$ indicates the emission wavelength in the organic green light-emitting layer, $\lambda_B$ indicates the emission wavelength in the organic blue light-emitting layer, and n indicates the positive integer.

In the above-mentioned cases, $L_R$, $L_G$, and $L_B$ can be set to the same value. The hole transport layer 2 or 12 in each of the devices for emitting lights of three colors of red, blue and green can be commonly formed in the same film thickness. This is preferable in that a manufacturing process can be simplified. A difference in film thickness between the respective color light-emitting devices is eliminated, so that the flatness of a display apparatus can be improved. This is also preferable in that excellent sealing can be performed. When each hole transport layer 2 or 12 is to be commonly formed in the same film thickness, it is preferable that n=1 be used for each of the devices for emitting lights of three colors of red, blue and green, or that n=6 for the red light-emitting device, n=4 for the green light-emitting device, and n=3 for the blue light-emitting device be used.

As described above, according to the present embodiment, the light-extraction efficiency is gradually improved by the current flow. Therefore, the improvement of the light-extraction efficiency is balanced with the reduction in internal quantum efficiency which is caused by the current flow, so that a multi-color display apparatus having little apparent deterioration of the durable luminance can be manufactured. Then, a multi-color display apparatus having little burn-in can be manufactured.

EXAMPLE 1

Example 1 and Comparative Example 1 show a manufacturing procedure of a multi-color display apparatus using the organic light-emitting devices each having the top-emission structure as shown in FIG. 2 in which the reflection electrode is made of Cr, and measured device characteristics thereof.

A substrate obtained by forming TFTs, circuits, Cr anodes (reflection electrodes), a planarizing film, a device isolation film, and the like on a glass and provided with an electrode for multi-color display which is capable of performing 200-ppi display (reference numerals 10 and 11 in FIG. 2) was subjected to UV/ozone cleaning.

Subsequently, the cleaned substrate and materials were set in a vacuum vapor deposition apparatus (produced by ULVAC KIKO, Inc.) and the vacuum vapor deposition apparatus was evacuated to $1 \times 10^{-6}$ Torr. After that, N,N'-α-di-naphthyl-benzidine (α-NPD) was deposited on the reflection electrode 10 to form the hole transport layer 12 with a film thickness of 40 nm.

Next, Ir complex (18 volume %) and 4,4'-N,N'-dicarbazole-biphenyl (CBP) in which red light emission is known were co-deposited in an electrode position for forming a red light-emitting device by using a mask vapor deposition method to form the light-emitting layer 13 for the red light-emitting device with a film thickness of 40 nm.

Next, in the same manner, coumarin dye (1.0 volume %) and tris[8-hydroxyquinolinate] aluminum (Alq3) in which green light emission is known were co-deposited in an electrode position for forming a green light-emitting device by using a mask vapor deposition method to form the light-emitting layer 13 for the green light-emitting device with a film thickness of 30 nm.

Next, in the same manner, perylene dye (1.0 vol %) and tris[8-hydroxyquinolinate] aluminum (Alq3) in which blue light emission is known were co-deposited by using a mask vapor deposition method to form the light-emitting layer 13 for a blue light-emitting device with a film thickness of 20 nm.

Next, phenanthroline compound expressed by the following chemical formula was deposited to form the electron transport layer 14 with a thickness of 10 nm.

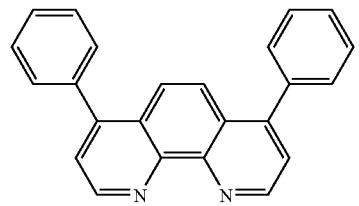

Next, cesium carbonate (0.9 vol %) and phenanthroline compound expressed by the above chemical formula were co-deposited on the electron transport layer 14 to form the electron injection layer 15 with a thickness of 40 nm.

Subsequently, the substrate obtained after the electron injection layer 15 was formed was transferred to another sputtering apparatus (produced by Osaka Vacuum, Ltd.) and an indium tin oxide (ITO) film was sputtered on the electron injection layer 15 by a sputtering method to form the light extraction electrode "b" with a thickness of 60 nm.

After that, the substrate was transferred to a grove box and sealed with a glass cap containing a drying agent under a nitrogen atmosphere.

Separately from the above, a hole transport layer 12 and light emitting layers 13 for emitting red, green and blue lights were formed as a single layer film on a quartz glass, respectively, and a light emission spectrum obtained from each single layer by using ultraviolet light irradiation was examined.

The peak $\lambda_R$ of the emission wavelength was 610 nm and a refractive index of α-NPD at this wavelength was 1.79.

Therefore, when n=1 and φ=π, an optical film thickness optimal to light extraction of $0.25\lambda_R \times (2n-\phi/\pi)$ is 152.5 nm. The optical film thickness $L_R$ of the formed film of α-NPD becomes 40 nm×1.79=71.6 nm.

Thus, the optical film thickness $L_R$ becomes a set value smaller than 152.5 nm, which is the film thickness optimal to initial light extraction, by approximately 53%, that is, a set value expressed by $0.25\lambda_R \times (2n-\phi/\pi-0.53)$.

The peak $\lambda_G$ of the emission wavelength was 530 nm and a refractive index of α-NPD at this wavelength was 1.81.

Therefore, when n=1 and φ=π, an optical film thickness optimal to light extraction of $0.25\lambda_G \times (2n-\phi/\pi)$ is 132.5 nm. The optical film thickness $L_G$ of the formed film of α-NPD becomes 40 nm×1.81=72.4 nm.

Thus, the optical film thickness $L_G$ becomes a value smaller than 132.5 nm, which is the film thickness optimal to initial light extraction, by approximately 45%, that is, a set value expressed by $0.25\lambda_G \times (2n-\phi/\pi-0.45)$.

The peak $\lambda_B$ of the emission wavelength was 470 nm and a refractive index of α-NPD at this wavelength was 1.86.

Therefore, when n=1 and φ=π, an optical film thickness optimal to light extraction of $0.25\lambda_B \times (2n-\phi/\pi)$ is 117.5 nm. The optical film thickness $L_B$ of the formed film of α-NPD becomes 40 nm×1.86=74.4 nm.

Thus, the optical film thickness $L_B$ becomes a value smaller than 117.5 nm, which is the film thickness optimal to initial light extraction, by approximately 37%, that is, a set value expressed by $0.25\lambda_B \times (2n-\phi/\pi-0.37)$.

Based on the examination of light emission characteristics of the multi-color display apparatus obtained through the above-mentioned manufacturing procedure, initial red light emission efficiency was calculated to obtain 2.2 cd/A. The durability measurement was performed at a constant current of 100 mA/cm², and the deterioration rate after 24 hours was 1%.

The film thicknesses and structures of respective red, green and blue light-emitting devices of Example 1 and the results obtained by measurement for the respective devices are summarized in Table 1. Although the initial light-extraction efficiency of the devices of Example 1 was not so high, the produced multi-color display apparatus was a preferable multi-color display apparatus using the devices in which the deterioration caused by the use of the device during current flow was suppressed.

COMPARATIVE EXAMPLE 1

A multi-color display apparatus was produced in the same manner as in Example 1, except that α-NPD was deposited in electrode positions for forming red, green and blue light-emitting devices by using a mask vapor deposition method to form the hole transport layers 12 with film thicknesses of 85 nm, 73 nm and 63 nm, respectively. Also, the same measurement as that in Example 1 was performed.

The optical film thickness $L_R$ of the film of α-NPD in the red light-emitting device is 85 nm×1.79=152.2 nm and thus becomes a value substantially equal to 152.5 nm which is the film thickness set value optimal to initial light extraction, that is, a set value expressed by $0.25\lambda_R \times (2n-\phi/\pi)$.

The optical film thickness $L_G$ of the film of α-NPD in the green light-emitting device is 73 nm×1.81=132.1 nm and thus becomes a value substantially equal to 132.5 nm which is the film thickness optimal to initial light extraction, that is, a set value expressed by $0.25\lambda_G \times (2n-\phi/\pi)$.

The optical film thickness $L_B$ of the film of α-NPD in the blue light-emitting device is 117.2 nm (=63 nm×1.86) and thus becomes a value substantially equal to 117.5 nm which is the film thickness optimal to initial light extraction, that is, a set value expressed by $0.25\lambda_B \times (2n-\phi/\pi)$.

The film thickness and structures of respective red, green and blue light-emitting devices of Comparative Example 1 and the results obtained by measurement for the respective devices are summarized in Table 1. Although the initial light-extraction efficiency of the devices of Comparative Example 1 was high, the produced multi-color display apparatus was a multi-color display apparatus using the devices having a large deterioration of durability.

EXAMPLE 2

Figure 3:
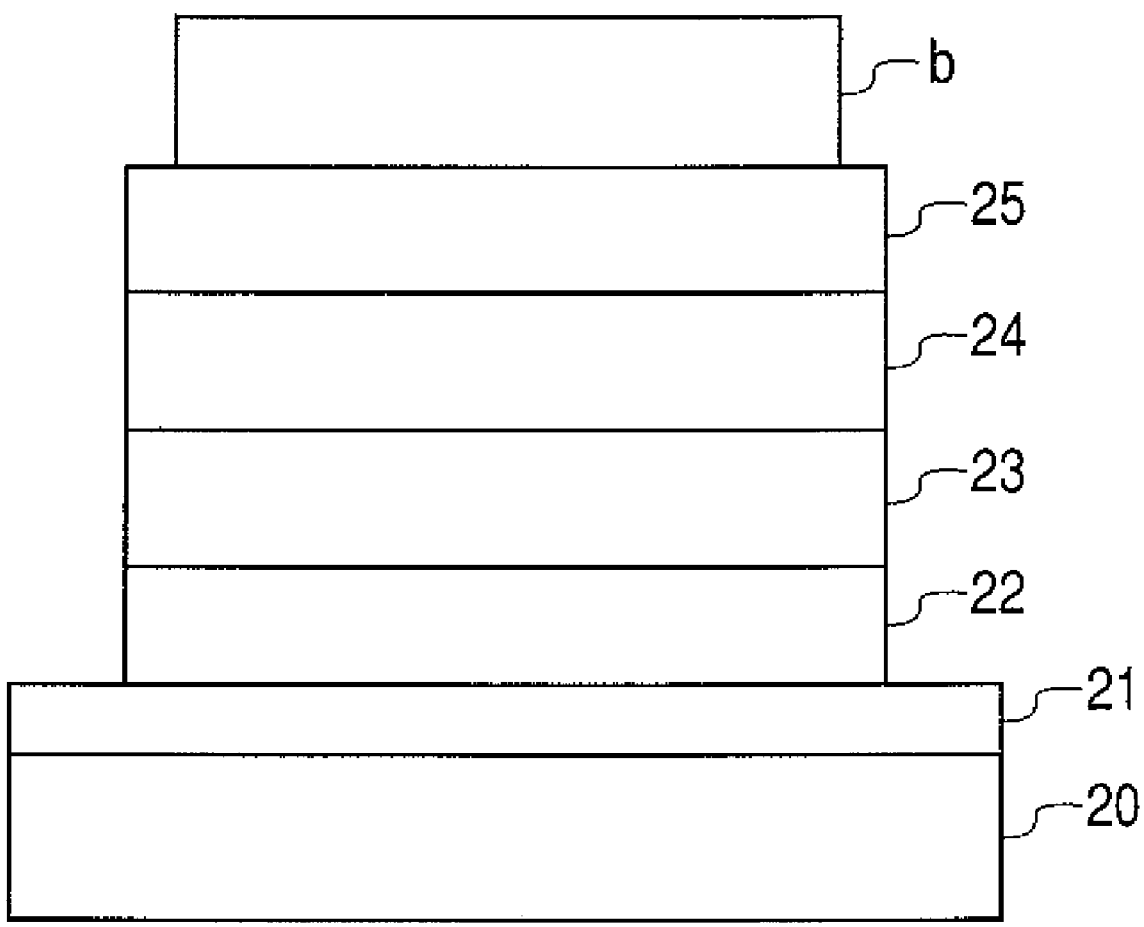
FIG. 3 is a schematic view showing an example of a stacked structure of a top-emission organic light-emitting device.

Example 2 and Comparative Example 2 show a manufacturing procedure of a multi-color display apparatus using the organic light-emitting devices each having the top-emission structure as shown in FIG. 3 in which the reflection layer is made of Ag and the transparent electrode "a" (anode) is made of IZO, and measured device characteristics thereof.

A substrate obtained by forming TFTs, circuits, Ag films serving as the reflection layers, IZO films (anodes) each having 20 nm serving as the transparent electrodes "a", a planarizing film, a device isolation film, and the like on a glass and provide with an electrode for multi-color display which is capable of performing 200-ppi display (reference numerals 20 and 21 and reference symbol "a" in FIG. 3) was subjected to UV/ozone cleaning.

After that, a multi-color display apparatus was produced in the same manner as in Example 1, except that α-NPD was deposited to form the hole transport layer 22 with a film thickness of 10 nm. The same measurement as that in Example 1 was performed.

When n=1 and φ=π, an optical film thickness optimal to light extraction of $0.25\lambda_R \times (2n-\phi/\pi)$ at the red emission wavelength $\lambda_R$ of 610 nm was 152.5 nm. A refractive index of the transparent electrode "a" (anode) at 610 nm was 2.04.

The optical film thickness $L_{aR}$ of the formed transparent electrode "a" (anode) becomes 20 nm×2.04=40.8 nm. The optical film thickness $L_R$ of the film of α-NPD becomes 10 nm×1.79=17.9 nm. The optical film thickness $L_{aR}+L_R$ of the reflection side becomes 40.8 nm+17.9 nm=58.7 nm.

Therefore, the optical film thickness $L_{aR}+L_R$ becomes a set value smaller than 152.5 nm which is the film thickness optimal to initial light extraction by approximately 62%, that is, a set value expressed by $0.25\lambda_R \times (2n-\phi/\pi-0.62)$.

When n=1 and φ=π, an optical film thickness optimal to light extraction of $0.25\lambda_G \times (2n-\phi/\pi)$ at the green emission wavelength $\lambda_G$ of 530 nm was 132.5 nm. A refractive index of the transparent electrode "a" (anode) at 530 nm was 2.10.

The optical film thickness $L_{aG}$ of the formed transparent electrode "a" (anode) becomes 20 nm×2.10=42.0 nm. The optical film thickness $L_G$ of the film of α-NPD becomes 10 nm×1.81=18.1 nm. The optical film thickness $L_{aG}+L_G$ of the reflection side becomes 42.0 nm+18.1 nm=60.1 nm.

Therefore, the optical film thickness $L_{aG}+L_G$ becomes a set value smaller than 132.5 nm, which is the film thickness optimal to initial light extraction, by approximately 55%, that is, a set value expressed by $0.25\lambda_G \times (2n-\phi/\pi-0.55)$.

When n=1 and φ=π, an optical film thickness optimal to light extraction of $0.25\lambda_B \times (2n-\phi/\pi)$ at the green emission wavelength $\lambda_B$ of 470 nm was 117.5 nm. A refractive index of the transparent electrode "a" (anode) at 470 nm was 2.16.

The optical film thickness $L_{aB}$ of the formed transparent electrode "a" (anode) becomes 20 nm×2.16=43.2 nm. The optical film thickness $L_B$ of the film of α-NPD becomes 10 nm×1.86=18.6 nm. The optical film thickness $L_{aB}+L_B$ of the reflection side becomes 43.2 nm+18.6 nm=61.8 nm.

Therefore, the optical film thickness $L_{aB}+L_B$ becomes a set value smaller than 117.5 nm, which is the film thickness optimal to initial light extraction, by approximately 47%, that is, a set value expressed by $0.25\lambda_B \times (2n-\phi/\pi-0.47)$.

The film thicknesses and structures of respective red, green and blue light-emitting devices of Example 2 and the results obtained by measurement for the respective devices are summarized in Table 1. Although the initial light-extraction efficiency of the devices of Example 2 was not so high, the produced multi-color display apparatus was a preferable multi-color display apparatus using the devices in which the deterioration caused by the use of the devices during current flow was suppressed.

COMPARATIVE EXAMPLE 2

A multi-color display apparatus was produced in the same manner as in Example 1, except that α-NPD was deposited in electrode positions for forming red, green and blue light-emitting devices by using a mask vapor deposition method to form the hole transport layer 12 with film thicknesses of 62 nm, 50 nm and 40 nm, respectively. The same measurement as that in Example 1 was performed.

The optical film thickness $L_R$ of the film of α-NPD in the red light-emitting device becomes 62 nm×1.79=111.0 nm. The optical film thickness $L_{aR}+L_R$ of reflection side becomes 40.8 nm+111.0 nm=151.8 nm.

Therefore, the optical film thickness $L_{aR}+L_R$ becomes a value substantially equal to 152.5 nm which is the film thickness optimal to initial light extraction, that is, a set value expressed by $0.25\lambda_R \times (2n-\phi/\pi)$.

The optical film thickness $L_G$ of the film of α-NPD in the green light-emitting device becomes 50 nm×1.81=90.5 nm. The optical film thickness $L_{aG}+L_G$ of reflection side becomes 42.0 nm+90.5 nm 132.5 nm.

Therefore, the optical film thickness $L_{aG}+L_G$ becomes a value equal to 132.5 nm which is the film thickness optimal to initial light extraction, that is, a set value expressed by $0.25\lambda_G \times (2n-\phi/\pi)$.

The optical film thickness $L_B$ of the film of α-NPD in the blue light-emitting device becomes 40 nm×1.86=74.4 nm. The optical film thickness $L_{aB}+L_B$ of reflection side becomes 43.2 nm+74.4 nm=117.6 nm.

Therefore, the optical film thickness $L_{aB}+L_B$ becomes a value substantially equal to 117.5 nm which is the film thickness optimal to initial light extraction, that is, a set value expressed by $0.25\lambda_B \times (2n-\phi/\pi)$.

The film thicknesses and structures of respective red, green and blue light-emitting devices and the results obtained by measurement for respective devices are summarized in Table 1. Although the initial light-extraction efficiency of the devices of Comparative Example 2 was high, the produced multi-color display apparatus using the devices had a large deterioration of durability.

EXAMPLE 3

Example 3 and Comparative Example 3 show a manufacturing procedure of a multi-color display apparatus using the organic light-emitting devices each having the top-emission structure as shown in FIG. 3 in which an Ag thin film was used as the light extraction electrode "b" located on a light extraction side, and measured device characteristics thereof.

A multi-color display apparatus was produced in the same manner as in Example 2, except that a film of Ag with a film thickness of 30 nm was formed as the light extraction electrode "b". The same measurement as that in Example 1 was performed.

A relationship between the film thickness of the reflection side and the wavelength is the same as that in Example 2. The film thicknesses and structures of the devices of Example 3 and the results obtained by measurement thereof are summarized in Table 1.

Although the initial light-extraction efficiency of the devices of Example 3 was not so high, the produced multi-color display apparatus was a preferable multi-color display apparatus using the devices in which the deterioration caused by the use of the devices during current flow was suppressed.

COMPARATIVE EXAMPLE 3

A multi-color display apparatus was produced in the same manner as in Example 3, except that α-NPD was deposited in electrode positions for forming red, green and blue light-emitting devices by using a mask vapor deposition method to form the hole transport layer 12 with film thicknesses of 62 nm, 50 nm and 40 nm, respectively. The same measurement as that in Example 1 was performed.

A relationship between the film thickness of the reflection side and the wavelength is the same as that in Comparative Example 2. The film thicknesses and structures the devices of Comparative Example 3 and the results obtained by measurement thereof are summarized in Table 1.

Although the initial light-extraction efficiency of the devices of Comparative Example 3 was high, the produced multi-color display apparatus using the devices had a large deterioration of durability.

In the multi-color display apparatus according to the present invention, the optical film thickness of the reflection side of the organic light-emitting device used for each of red, green and blue light-emitting devices is set to be shorter than each of their wavelength enhancement conditions in a predetermined range, respectively.

Thus, although the initial emission luminance becomes slightly lower, it was shown to make it possible to provide a multi-color display apparatus in which the apparent deterioration of the durable luminance is suppressed.

TABLE 1

| | | Optical film thickness of reflection side which is optimal for initial extraction efficiency [nm] (0.25 × λ) | Optical film thickness L or La + L of the reflection side [nm] | Optical film thickness set to be small [nm] | Percentage of the optical thickness set to be small with respect to 0.25λ [%] | Initial efficiency [cd/A] | Durability deterioration rate after 24 hours [%] |
|---|---|---|---|---|---|---|---|
| Example 1 | Red | 152.5 | 71.6 | 80.9 | 53.0 | 2.2 | 1 |
| | Green | 132.5 | 72.4 | 60.1 | 45.4 | 3.8 | 3 |
| | Blue | 117.5 | 74.4 | 43.1 | 36.7 | 2.1 | 5 |

TABLE 1-continued

| | | Optical film thickness of reflection side which is optimal for initial extraction efficiency [nm] (0.25 × λ) | Optical film thickness L or La + L of the reflection side [nm] | Optical film thickness set to be small [nm] | Percentage of the optical thickness set to be small with respect to 0.25λ [%] | Initial efficiency [cd/A] | Durability deterioration rate after 24 hours [%] |
|---|---|---|---|---|---|---|---|
| Comparative Example 1 | Red | 152.5 | 152.2 | 0.3 | 0.2 | 4.0 | 40 |
| | Green | 132.5 | 132.1 | 0.4 | 0.3 | 6.5 | 35 |
| | Blue | 117.5 | 117.2 | 0.3 | 0.3 | 3.4 | 38 |
| Example 2 | Red | 152.5 | 58.7 | 93.8 | 61.5 | 3.9 | 1 |
| | Green | 132.5 | 60.1 | 72.4 | 54.6 | 6.4 | 2 |
| | Blue | 117.5 | 61.8 | 55.7 | 47.4 | 2.2 | 4 |
| Comparative Example 2 | Red | 152.5 | 151.8 | 0.7 | 0.5 | 7.8 | 32 |
| | Green | 132.5 | 132.5 | 0.0 | 0.0 | 11.0 | 27 |
| | Blue | 117.5 | 117.6 | −0.1 | −0.1 | 3.5 | 30 |
| Example 3 | Red | 152.5 | 58.7 | 93.8 | 61.5 | 3.9 | 1 |
| | Green | 132.5 | 60.1 | 72.4 | 54.6 | 6.7 | 2 |
| | Blue | 117.5 | 61.8 | 55.7 | 47.4 | 1.9 | 3 |
| Comparative Example 3 | Red | 152.5 | 151.8 | 0.7 | 0.5 | 7.8 | 34 |
| | Green | 132.5 | 132.5 | 0.0 | 0.0 | 12.5 | 29 |
| | Blue | 117.5 | 117.6 | −0.1 | −0.1 | 3.9 | 37 |

This application claims priority from Japanese Patent Application No. 2005-191290 filed on June 30, and 2006-154471 filed on Jun. 2, 2006, which are hereby incorporated by reference herein.

The invention claimed is:

1. A multi-color display apparatus comprising:

organic light-emitting devices for emitting lights of at least three colors of red, blue and green, respectively, each of the devices comprising an anode including a metal layer for reflecting light, a carrier transport layer contacting the anode, a light-emitting layer contacting the carrier transport layer, and a cathode for transmitting light, wherein each of the devices further comprises a reflection plane on a surface of the metal layer of the anode;

wherein the carrier transport property of the light-emitting layer of each of the devices is electron transport property;

wherein an optical distance $l_R$ between the reflection plane and an interface of the light-emitting layer on the anode of the red light-emitting device is within a range expressed by $0.25\lambda_R \times (2n-\phi/\pi-0.7) < l_R < 0.25\lambda_R \times (2n-\phi/\pi-0.5)$ where $\lambda_R$ indicates an emission wavelength in the light-emitting layer of the red light-emitting device, n indicates a positive integer, and $\phi$ indicates a phase shift on the anode;

wherein an optical distance $l_G$ between the reflection plane and an interface of the light-emitting layer on the anode of the green light-emitting device is within a range expressed by $0.25\lambda_G \times (2n-\phi/\pi-0.6) < l_G < 0.25\lambda_G \times (2n-\phi/\pi-0.4)$ where $\lambda_G$ indicates an emission wavelength in the light-emitting layer of the green light-emitting device, n indicates the positive integer, and $\phi$ indicates the phase shift on the anode; and wherein an optical distance $l_B$ between the reflection plane and an interface of the light-emitting layer on the anode of the blue light-emitting device is within a range expressed by $0.25\lambda_B \times (2n-\phi/\pi-0.5) < l_B < 0.25\lambda_B \times (2n-\phi/\pi-0.3)$ where $\lambda_B$ indicates an emission wavelength in the light-emitting layer of the blue light-emitting device, n indicates the positive integer, and $\phi$ indicates the phase shift on the anode.

2. A multi-color display apparatus comprising:

organic light-emitting devices for emitting lights of at least three colors of red, blue and green, respectively, each of the devices comprising a cathode including a metal layer for reflecting light, a carrier transport layer contacting the cathode, a light-emitting layer contacting the carrier transport layer, and an anode for transmitting light, wherein each of the devices further comprises a reflection plane on a surface of the metal layer of the cathode;

wherein the carrier transport property of the light-emitting layer of each of the devices is hole transport property;

wherein an optical distance $l_R$ between the reflection plane and an interface of the light-emitting layer on the cathode of the red light-emitting device is within a range expressed by $0.25\lambda_R \times (2n-\phi/\pi-0.7) < l_R < 0.25\lambda_R \times (2n-\phi/\pi-0.5)$ where $\lambda_R$ indicates an emission wavelength in the light-emitting layer of the red light-emitting device, n indicates a positive integer, and $\phi$ indicates a phase shift on the cathode;

wherein an optical distance $l_G$ between the reflection plane and an interface of the light-emitting layer on the cathode of the green light-emitting device is within a range expressed by $0.25\lambda_G \times (2n-\phi/\pi-0.6) < l_G < 0.25\lambda_G \times (2n-\phi/\pi-0.4)$ where $\lambda_G$ indicates an emission wavelength in the light-emitting layer of the green light-emitting device, n indicates the positive integer, and $\phi$ indicates the phase shift on the cathode; and wherein an optical distance $l_B$ between the reflection plane and an interface of the light-emitting layer on the cathode of the blue light-emitting device is within a range expressed by $0.25\lambda_B \times (2n-\phi/\pi-0.5) < l_B < 0.25\lambda_B \times (2n-\phi/\pi-0.3)$ where $\lambda_B$ indicates an emission wavelength in the light-emitting layer of the blue light-emitting device, n indicates the positive integer, and $\phi$ indicates the phase shift on the cathode.

3. A multi-color display apparatus comprising:

organic light-emitting devices for emitting lights of at least three colors of red, blue and green, respectively, each of the devices comprising an anode including a metal layer for reflecting light, a carrier transport layer contacting the anode, a light-emitting layer contacting the carrier transport layer, and a cathode for transmitting light, wherein each of the devices further comprises a reflection plane on a surface of the metal layer of the anode;

wherein the carrier transport property of the light-emitting layer of each of the devices is hole transport property;

wherein an optical distance $l_R$ between the reflection plane and an interface of the light-emitting layer on the cathode of the red light-emitting device is within a range expressed by $0.25\lambda_R \times (2n - \phi/\pi + 0.3) < l_R < 0.25\lambda_R \times (2n - \phi/\pi + 0.5)$ where $\lambda_R$ indicates an emission wavelength in the light-emitting layer of the red light-emitting device, n indicates a positive integer, and $\phi$ indicates a phase shift on the anode;

wherein an optical distance $l_G$ between the reflection plane and an interface of the light-emitting layer on the cathode of the green light-emitting device is within a range expressed by $0.25\lambda_G \times (2n - \phi/\pi + 0.4) < l_G < 0.25\lambda_G \times (2n - \phi/\pi + 0.6)$ where $\lambda_G$ indicates an emission wavelength in the light-emitting layer of the green light-emitting device, n indicates the positive integer, and $\phi$ indicates the phase shift on the anode; and wherein an optical distance $l_B$ between the reflection plane and an interface of the light-emitting layer on the cathode of the blue-light emitting device is within a range expressed by $0.25\lambda_B \times (2n - \phi/\pi + 0.5) < l_B < 0.25 \times (2n - \phi/\pi + 0.7)$ where $\lambda_B$ indicates an emission wavelength in the light-emitting layer of the blue light-emitting device, n indicates the positive integer, and p indicates the phase shift on the anode.

4. A multi-color display apparatus comprising:

organic light-emitting devices for emitting lights of at least three colors of red, blue and green, respectively, each of the devices comprising a cathode including a metal layer for reflecting light, a carrier transport layer contacting the cathode, a light-emitting layer contacting the carrier transport layer, and an anode for transmitting light, wherein each of the devices further comprises a reflection plane on a surface of the metal layer of the cathode;

wherein the carrier transport property of the light-emitting layer of each of the devices is electron transport property;

wherein an optical distance $l_R$ between the reflection plane and an interface of the light-emitting layer on the anode of the red light-emitting device is within a range expressed by $0.25\lambda_R \times (2n - \phi/\pi + 0.3) < l_R < 0.25\lambda \times (2n - \phi/\pi + 0.5)$ where $\lambda_R$ indicates an emission wavelength in the light-emitting layer of the red light-emitting device, n indicates a positive integer, and $\phi$ indicates a phase shift on the cathode;

wherein an optical distance $l_G$ between the reflection plane and an interface of the light-emitting layer on the anode of the green light-emitting device is within a range expressed by $0.25\lambda_G \times (2n - \phi/\pi + 0.4) < l_G < 0.25\lambda_G \times (2n - \phi/\pi + 0.6)$ where $\lambda_G$ indicates an emission wavelength in the light-emitting layer of the green light-emitting device, n indicates the positive integer, and $\phi$ indicates the phase shift on the cathode; and wherein an optical distance $l_B$ between the reflection plane and an interface of the light-emitting layer on the anode of the blue-light emitting device is within a range expressed by $0.25\lambda_B \times (2n - \phi/\pi + 0.5) < l_B < 0.25\lambda \times (2n - \phi/\pi + 0.7)$ where $\lambda_B$ indicates an emission wavelength in the light-emitting layer of the blue light-emitting device, n indicates the positive integer, and $\phi$ indicates the phase shift on the cathode.

5. The multi-color display apparatus according to claim 1 or 3, wherein the anode of each of the devices further includes a transparent conductive material layer.

6. The multi-color display apparatus according to claim 1 or 3, wherein the cathode of each of the devices includes a metal film.

7. The multi-color display apparatus according to claim 2 or 4, wherein the cathode of each of the devices further includes a transparent conductive material layer.

8. The multi-color display apparatus according to claim 2 or 4, wherein the anode of each of the devices includes a metal film.

9. The multi-color display apparatus according to claim 1 or 3, wherein the carrier transport layer is in contact with the anode and the light-emitting layer and is formed in common to the devices of the three light colors in the same film thickness.

10. The multi-color display apparatus according to claim 2 or 4, wherein the carrier transport layer is in contact with the cathode and the light-emitting layer and is formed in common to the devices of the three light colors in the same film thickness.

* * * * *